United States Patent
Wan et al.

(10) Patent No.: US 12,136,564 B2
(45) Date of Patent: Nov. 5, 2024

(54) SUPERSTRATE AND METHOD OF MAKING IT

(71) Applicant: CANON KABUSHIKI KAISHA, Tokyo (JP)

(72) Inventors: Fen Wan, Austin, TX (US); Weijun Liu, Cedar Park, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 470 days.

(21) Appl. No.: 16/834,465

(22) Filed: Mar. 30, 2020

(65) Prior Publication Data
US 2021/0305082 A1 Sep. 30, 2021

(51) Int. Cl.
*H01L 21/687* (2006.01)
*H01L 21/02* (2006.01)
*H01L 21/768* (2006.01)

(52) U.S. Cl.
CPC .. *H01L 21/68757* (2013.01); *H01L 21/02282* (2013.01); *H01L 21/76804* (2013.01)

(58) Field of Classification Search
CPC ......... H01L 21/68757; H01L 21/02282; H01L 21/6715; G03F 7/0015
See application file for complete search history.

(56) References Cited

U.S. PATENT DOCUMENTS

| | | | |
|---|---|---|---|
| 5,980,985 A | 11/1999 | Kikuchi | |
| 6,140,254 A | 10/2000 | Endisch et al. | |
| 8,556,616 B2 * | 10/2013 | Resnick | B82Y 10/00 425/470 |
| 9,472,442 B2 * | 10/2016 | Priewasser | H01L 23/544 |
| 10,192,741 B2 * | 1/2019 | Nishimura | H01L 21/0334 |
| 11,137,536 B2 * | 10/2021 | Colburn et al. | G02B 6/0065 |
| 11,187,986 B2 | 11/2021 | Waller | |
| 2010/0062098 A1 * | 3/2010 | Ando | B29C 33/38 216/41 |
| 2015/0187570 A1 | 7/2015 | Haider et al. | |
| 2017/0036547 A1 | 12/2017 | Takahito | |
| 2017/0365470 A1 * | 12/2017 | Nishimura | H01L 21/0334 |

(Continued)

FOREIGN PATENT DOCUMENTS

| | | |
|---|---|---|
| EP | 2163367 A1 | 3/2010 |
| TW | 201839115 A | 11/2018 |

(Continued)

OTHER PUBLICATIONS

Thomas A. Anhoj, et al. "Optimization of SU-8 processing for integrated optics", Proc. SPIE 6110, Micromachining Technology for Micro-Optics and Nano-Optics IV, 611009 (Jan. 23, 2006).

(Continued)

*Primary Examiner* — Phat X Cao
(74) *Attorney, Agent, or Firm* — Abel Schillinger, LLP (57) ABSTRACT

A superstrate can comprise a superstrate blank and a coating overlying an outer surface of the superstrate blank. The superstrate blank can comprises a central region and a tapered edge region, wherein the tapered edge region has an average taper angle of not greater than 20 degrees relative to a length direction of the superstrate blank. In one embodiment, the coating of the superstrate can be applied by spin coating and may have an edge bead below a plane of the coating surface within the central region.

18 Claims, 6 Drawing Sheets

(56) References Cited

U.S. PATENT DOCUMENTS

2021/0066140 A1* 3/2021 Hyun .................. H01L 21/6715

FOREIGN PATENT DOCUMENTS

TW          201946162 A    12/2019
WO       2018031896 A1     2/2018

OTHER PUBLICATIONS

Y.-J. Chuang, et al. "Reduction of diffraction effect of UV exposure on SU-8 negative thick photoresist by air gap elimination", Microsystem Technologies 8 (2002) 308-313, Springer-Verlag 2002.
David J. Elliott, et al. "Wafer edge bead cleaning with laser radiation and reactive gas", Solid State Phenomena vol. 187 (2012) pp. 117-120.
Hun Lee, et al. "A new fabrication process for uniform SU-8 thick photoresist structures by simultaneously removing edge bead and air bubbles", Journal of Micromechanics and Microengineering, 2011.
Hyeoung Woo Park, et al. "Simple and Cost-Effective Method for Edge Bead Removal by Using a Taping Method", Journal of the Korean Physical Society, vol. 73, No. 10, Nov. 2018, pp. 1473-1478.

\* cited by examiner

SUPERSTRATE AND METHOD OF MAKING IT

FIELD OF THE DISCLOSURE

The present disclosure relates to a superstrate comprising a coating and a method of making the superstrate.

BACKGROUND

Inkjet Adaptive Planarization (IAP) requires the use of a superstrate with a high flatness of its working surface. A superstrate designed for an IAP process is often coated with a thin polymeric film for the purpose of reducing defects, increasing the throughput and extending its lifetime. The coating is typically applied by spin coating. An often observed problem of spin coating is an increased thickness at the outer end of the coating, also called an edge bead. An edge bead can lead to production defects or a reduction of the total working area usable for planarization. It is known to remove the edge bead by subsequent treatment operations, which require, however, additional work efforts and can introduce other defects.

There is a need to improve the quality of superstrates, specifically to combine properties such as high surface planarity without defects, long lifetime at high throughput, and a high percentage of the actual working surface area. It is further desirable to enhance the efficiency of making such superstrates.

SUMMARY

In one embodiment, a superstrate can comprise a superstrate blank and a coating overlying an outer surface of the superstrate blank, wherein the superstrate blank can comprises a central region and a tapered edge region; the tapered edge region can have a taper angle of not greater than 20 degrees relative to a radial direction of the superstrate blank; and the coating can overly the central region and at least a portion of the tapered edge region of the superstrate blank.

In one aspect, the coating of the superstrate can comprise an edge bead within the tapered edge region, wherein an apex of the edge bead can be below a plane of an outer surface of the coating in the central region of the superstrate.

In a further aspect, a surface area ratio Sc:St of the superstrate blank may be at least 15, with Sc being a surface area of the central region and St being a surface area of the tapered edge region.

In another aspect, a depth of the taper $T_d$ at the outer edge of the superstrate blank from a level of the outer surface of the central region of the superstrate blank relative to a height direction of the superstrate blank can be at least 20 microns and not greater than 400 microns.

In a further aspect, a length of the tapered edge region ($T_1$) in radial direction of the superstrate can be at least 1.0 mm.

In yet a further aspect, the superstrate blank can have an average thickness within the central region of at least 100 microns and not greater than 5000 microns.

In another aspect, the coating of the superstrate can have an average thickness within the central region of at least 0.1 microns and not greater than 10 microns.

In yet another particular aspect, the tapered edge region can have a taper angle of not greater than 10 degrees.

In another embodiment, a method of forming a superstrate can comprise: preparing a superstrate blank comprising a central region and a tapered edge region, wherein a taper angle of the tapered edge region relative to a radial direction of the superstrate blank may be not greater than 20 degrees; and applying a coating on an outer surface of the superstrate blank, wherein the coating overlies the complete central region and at least a portion of the tapered edge region.

In one aspect of the method, applying the coating on the superstrate blank can comprise spin coating.

In another aspect of the method, spin coating can comprise forming an edge bead within the tapered edge region of the superstrate blank.

In one aspect, the method can further comprise removing of the edge bead. In a particular aspect, wherein removing of the edge bead may comprise washing with a solvent.

In an aspect of the method, a surface area ratio Sc:St of the superstrate blank may be at least 15, with Sc being a surface area of the central region and St being a surface area of the tapered edge region.

In yet another aspect of the method, spin coating may not include forming of an edge bead on the superstrate blank.

In a further aspect of the method, a length of the tapered edge region ($T_1$) in radial direction of the superstrate can be at least 1.0 mm.

In yet another aspect of the method, the coating can have an average thickness within the central region of at least 0.1 microns and not greater than 10 microns.

In another aspect of the method, a depth of the taper Ta at the outer edge of the superstrate blank from a level of the outer surface of the central region of the superstrate blank relative to a height direction of the superstrate blank can be at least 20 microns and not greater than 400 microns.

In a further aspect, the taper angle of the tapered edge region can be not greater than 10 degrees.

In one embodiment, a method of manufacturing an article can comprise: applying a layer of a formable composition on a substrate; bringing the formable composition into contact with a superstrate, wherein the superstrate comprises a superstrate blank and a coating overlying an outer surface of the superstrate blank, and wherein the superstrate blank comprises a central region and a tapered edge region, the tapered edge region has a taper angle of not greater than 20 degrees relative to a length direction of the superstrate blank, and the coating is overlying the central region and at least a portion of the tapered edge region of the superstrate blank; curing the formable composition with light or heat to form a cured layer; removing the superstrate from the cured layer; and processing the substrate with the cured layer to make the article.

BRIEF DESCRIPTION OF THE DRAWINGS

Embodiments are illustrated by way of example and are not limited in the accompanying figure.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description is provided to assist in understanding the teachings disclosed herein and will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

As used herein, the terms "comprises," "comprising." "includes," "including." "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

As used herein, and unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

The present disclosure is directed to a superstrate comprising a superstrate blank and a coating overlying an outer surface of the superstrate blank. The superstrate blank is designed that it contains a central region and a tapered edge region. In one embodiment, the tapered edge region can be the location for an edge bead formed during spin-coating of a coating on the superstrate blank, wherein an apex of the edge bead of the coating may be below the plane of the outer surface of the coating in the central region of the superstrate. In another embodiment, the forming of an edge bead during spin coating can be completely avoided.

Figure 1:
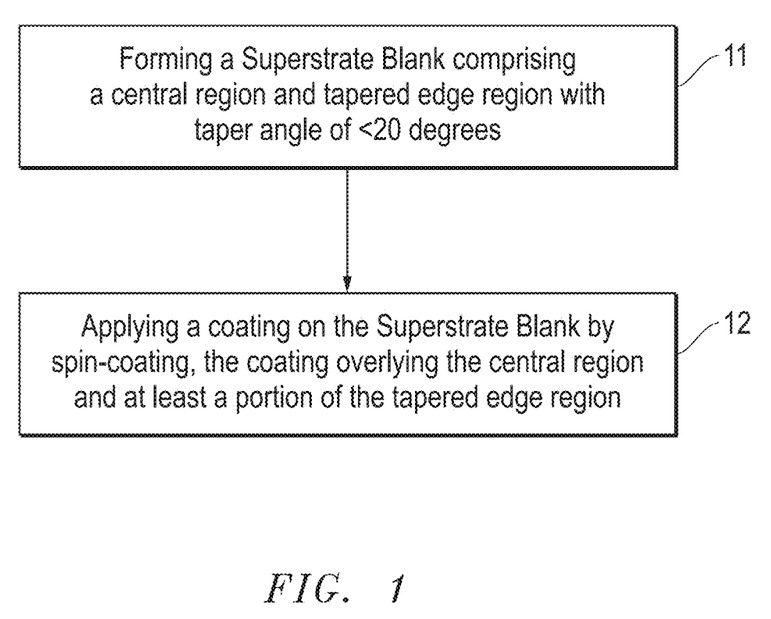
FIG. 1 includes a scheme describing a method of forming a superstrate according to one embodiment.

As illustrated in FIG. 1, a method of forming the superstrate of the present disclosure can comprise the following steps: 11) forming a superstrate blank comprising a central region and a tapered edge region, wherein a taper angle of the tapered edge region relative to a length direction of the superstrate blank is not greater than 20 degrees, and 12) applying a coating on an outer surface of the superstrate blank, wherein the coating overlies the complete central region and at least a portion of the tapered edge region.

Forming of the superstrate blank (11) can be conducted by using a standard commercial wafer, e.g., a thin slice cut from a round wafer ingot, and subjecting the wafer to controlled cutting and/or polishing to remove wafer material to form a smooth declining taper at the edge region of the wafer. In a particular embodiment, the taper can be formed by controlled polishing. In another aspect, the taper of the wafer can be made by controlled etching.

Figure 2A:
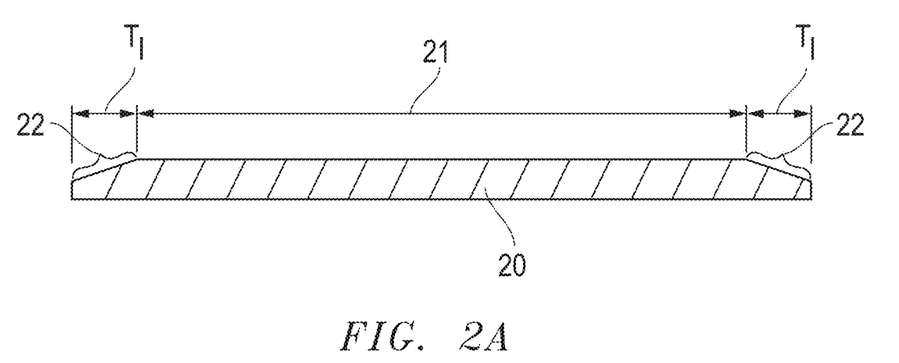
FIG. 2A illustrates a side view of a superstrate blank according to one embodiment.

FIG. 2A includes an illustration of a side view of a superstrate blank 20 according to an embodiment of the present disclosure, showing the central region (21) and the tapered edge region (22) of the superstrate blank.

Figure 2B:
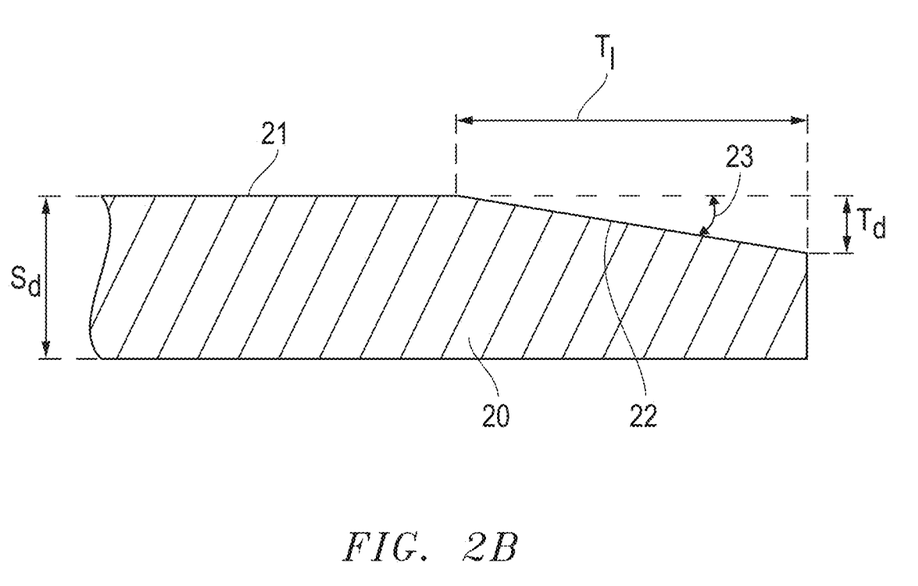
FIG. 2B illustrates an enlarged side view of a portion of the superstrate blank shown in FIG. 2A according to one embodiment.

FIG. 2B illustrates an enlarged section of the superstrate shown in FIG. 2A, showing the entire tapered edge region (22) and a portion of the central region (21). It can be seen a smooth transition from the central region (21) to the tapered edge region (22). The average taper angle (23) of the taper throughout the tapered edge region (22) may be not greater than 20 degrees. In a certain aspect, as illustrated in FIG. 2B, the taper angle can be the same throughout the tapered edge region. In another certain aspect (not shown), the taper angle can vary within the tapered edge region, for example, the taper angle can increase towards the outer edge. In aspects, the average taper angle throughout the tapered edge region may be not greater than 18 degrees, such as not greater than 15 degrees, not greater than 10 degrees, not greater than 8 degrees, not greater than 7 degrees, not greater than 6 degrees, not greater than 5 degrees, or not greater than 3 degrees.

In certain aspects, the diameter of the superstrate blank, including the central region (21) and tapered edge region (22), can be at least 50 mm, such as at least 100 mm, at least 150 mm, at least 200 mm, at least 250 mm, at least 280 mm, or at least 290 mm. In other aspects, the diameter of the central region may be not greater than 600 nm, such as not greater than 500 mm, not greater than 450 mm, or not greater than 400 mm. The diameter of the superstrate blank can be a value between any of the minimum and maximum valued noted above.

In one aspect, a surface area ratio Sc:St of the superstrate blank, with Sc being the surface area of the central region (21), and St being the surface area of the tapered edge region (21), can be at least 15, such as at least 20, at least 30, at least 40, at least 45, or at least 50.

In another aspect, the thickness of the superstrate blank (Sa) at the central region (21) can be at least 100 microns, such as at least 150 microns, at least 200 microns, at least 300 microns, at least 500 microns, at least 1000 microns, or at least 2000 microns. In another aspect, the thickness may be not greater than 5000 microns, not greater than 4000 microns, or not greater than 3000 microns. The thickness of the superstrate blank in the central region can be a value between any on the minimum and maximum values note above.

The tapered edge region (22) of the superstrate blank of the present disclosure can have a length ($T_1$) in radial direction (x-axis) of at least 1.0 mm, such as at least 1.5 mm, at least 1.8 mm, at least 2.0 mm, at least 2.3 mm, at least 2.5 mm, or at least 3.0 mm. In another aspect, the tapered edge region ($T_1$) may be not greater than 5.0 mm, such as not greater than 4.5 mm, not greater than 4.0 mm, or not greater than 3.5 mm. It will be appreciated that $T_1$ of the tapered edge region may be a value between any of the minimum and maximum numbers noted above.

In a further aspect, the depth of the taper ($T_d$) at the outer edge of the superstrate blank from a level of the outer surface of the central region of the superstrate blank in a height direction (y-axis) of the superstrate blank can be at least 20 microns, such as at least 30 microns, or at least 50 microns, or at least 80 microns, or at least 100 microns. In another aspect, the taper depth ($T_d$) may be not greater than 400 microns, such as not greater than 350 microns, not greater than 300 microns, not greater than 250 microns, not greater than 200 microns, or not greater than 150 microns. The depth of the taper ($T_d$) can be a value between any of the minimum and maximum values noted above. In a certain instance, $T_d$ can be the same as the thickness of the superstrate blank in the central region. For example, if the superstrate blank has a thickness of 100 microns in the central region, $T_d$ can be also 100 microns.

The superstrate blank can be made from a variety of materials. Non-limiting examples of materials can include a glass-based material, silicon, a spinel, a fused-silica, quartz, an organic polymer, a siloxane polymer, a fluorocarbon polymer, a metal, a metal alloy, hardened sapphire, a deposited oxide, anodized alumina, an organo-silane, an organo-silicate material, inorganic polymers, or any combination thereof. The glass-based material can include soda lime glass, borosilicate glass, alkali-barium silicate glass, quartz glass, aluminosilicate glass, or synthetic fused-silica.

In one embodiment of the method of the present disclosure, applying the coating on the superstrate blank (12) can be conducted by spin-coating. By using the tapered superstrate blank of the above-described structure, a protective coating can be formed on the superstrate blank, wherein the edge bead of the coating can be moved down to the slope of the taper.

In a certain aspect of the present disclosure, forming of an edge bead can be even completely avoided. This could not be achieved if spin-coating was conducted on superstrate blanks not containing the tapered edge region of the present invention.

Figure 3A:
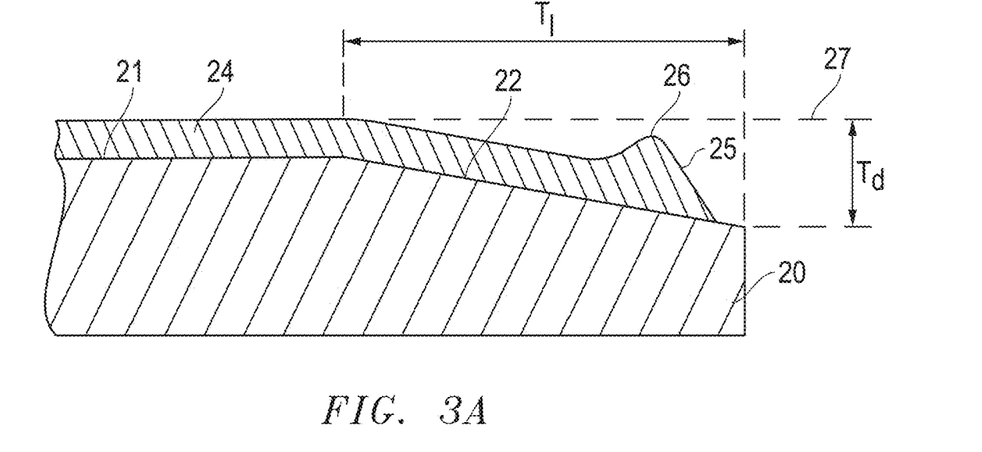
FIG. 3A illustrates side view of a portion of a superstrate according to one embodiment.

FIG. 3A illustrates an embodiment of a superstrate wherein a coating (24) is applied on a superstrate blank (20) via spin-coating. FIG. 3A shows only a section of the superstrate with a complete tapered edge region (22) and a portion of the central region (21). It can be seen that the coating (24) may evenly overly the central region (21) of the superstrate blank and can form an edge bead (25) within the tapered edge region (22). In one aspect, the apex (26) of the edge bead (25) may be below the plane (27) of an outer surface of the coating (24) within the central region (21).

In one embodiment, the coating (24) can be a polymeric coating. Non-limiting examples of polymeric coating materials can be poly(methyl methacrylate) (PMMA), fluoropolymers, or polyethylene terephthalate or any polymer that is transparent to a selected actinic radiation used for curing a formable material during the planarization process, for example, a certain UV light wave range.

In another embodiment, the coating (24) can have an average thickness within the central region of at least 0.1 microns, such as at least 0.5 microns, at least 1.0 micron, at least 2.0 microns, at least 3 microns, or at least 5 microns. In another aspect, the coating within the central region may be not greater than 10 microns, such as not greater than 8 microns, or not greater than 6 microns. The coating thickness within the central region can be a value between any of the minimum and maximum values noted above.

In a certain embodiment, the coating (24) can be a single-layer coating. In another certain embodiment, the coating can be a multi-layer coating.

The coating (24) can have a high flatness and smoothness throughout the central region. In one aspect, the surface roughness of the coating within the central region may be not greater than 5 nm, such as not greater than 3 nm, or not greater than 2 nm, or not greater than 1.5 nm, or not greater than 1 nm.

Figure 4A:
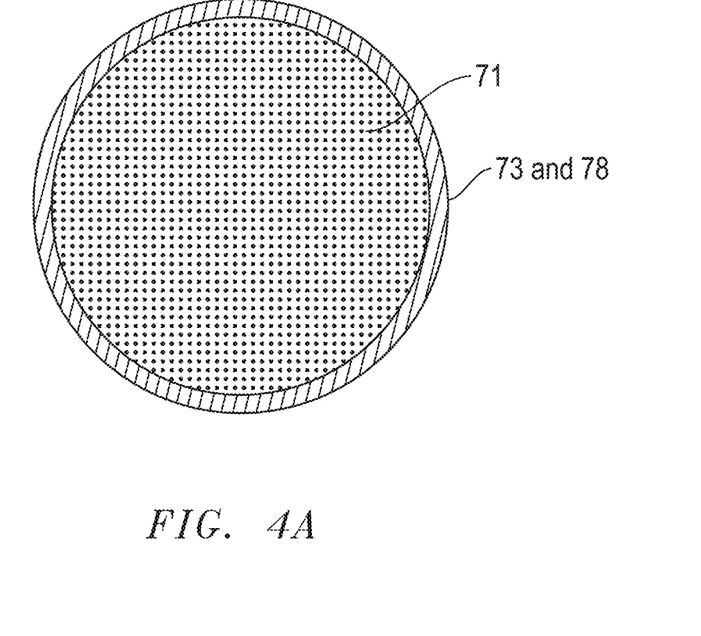
FIG. 4A illustrates a top view of a superstrate according to one embodiment.
Figure 4B:
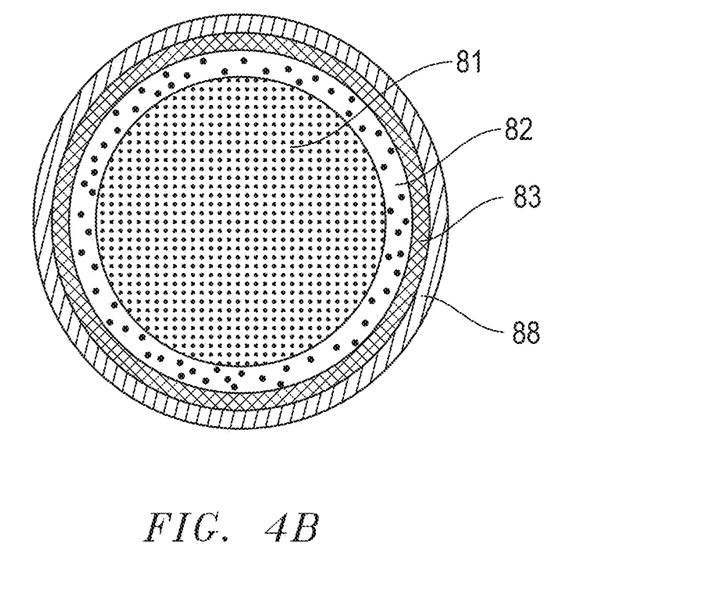
FIG. 4B illustrates a top view of a comparative superstrate.

A further advantage of the superstrate of the present disclosure can be that the tapered edge region may be part of the separation zone of the superstrate. The separation zone is a region at the outer edge of the superstrate which can contain a recess or gap with the function to break the vacuum between superstrate and substrate after the planarization step, in order to help separating the superstrate from the substrate. The separation zone typically has a radial length of about 2-3 mm and does not participate as contact surface area for the planarization of a substrate. As illustrated in FIG. 4A, by modifying the separation zone to a tapered edge region, such that tapered edge region (73) and separation zone (78) cover the same wafer area, it is possible to transfer a formed edge bead to the region of the separation zone and to obtain a large surface area (71) suitable for planarizing a substrate. In comparison, a typical superstrate with a spin-coated protection coating contains a separation zone (88) and an edge bead zone (83) next to the separation zone (88), as illustrated in FIG. 4B. Furthermore, a region next to the edge bead zone (83), herein called "edge-neighboring zone" (82) should be considered, wherein a much higher likelihood of defects can be expected caused by the efforts of removing the edge bead, and may also be substracted from the suitable surface area (81) for planarizing a substrate. Accordingly, the superstrate of the present invention has the advantage that a large surface area (71) can be used for planarizing a substrate, and a removal of the edge bead may not be necessary. Moreover, this allows that additional process steps can be avoided, and may reduce the danger of creating damages to the superstrate during removal of the edge bead.

Figure 5:
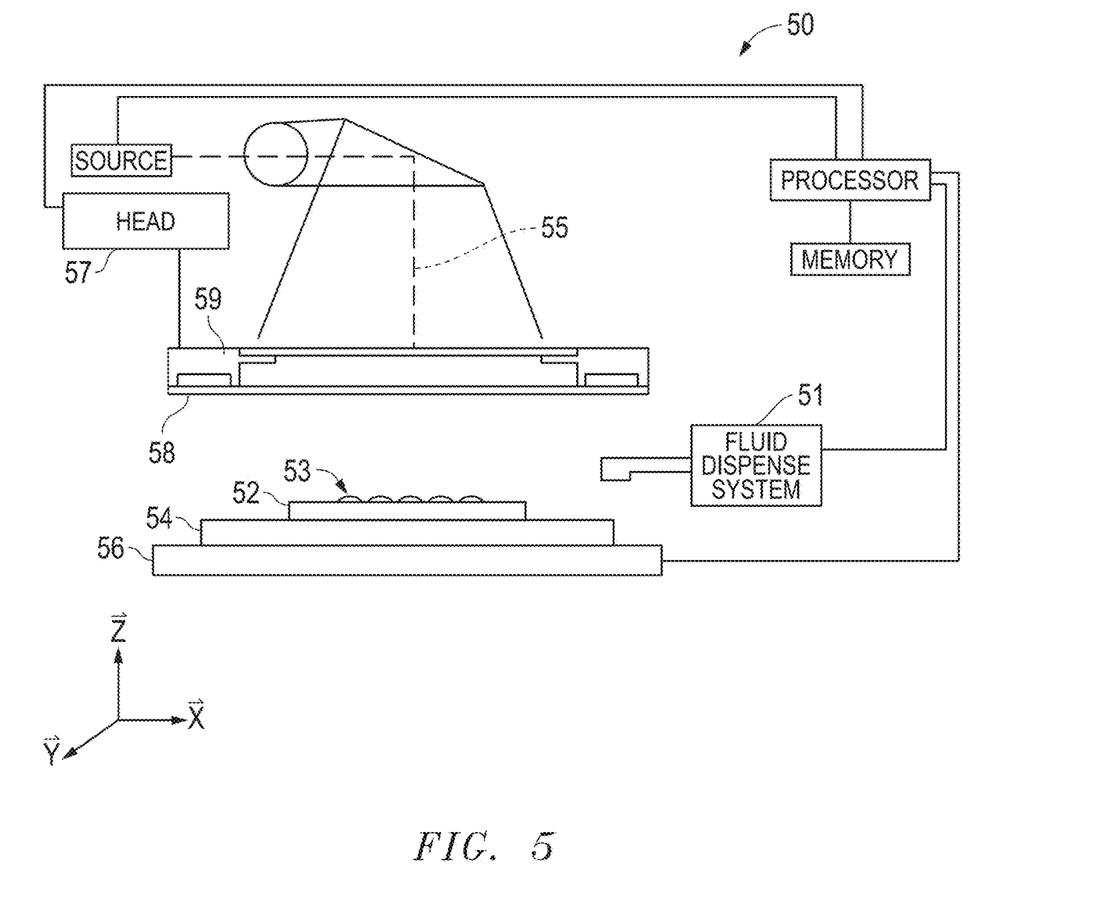
FIG. 5 illustrates an apparatus including a superstrate according to one embodiment.

Referring to FIG. 5, an apparatus (50) in accordance with an embodiment described herein can be used to planarize a substrate (52) using a superstrate (58) of the present disclosure. The superstrate (58) can be positioned spaced-apart from the substrate (52).

The substrate (52) may be a semiconductor base material, such as a silicon wafer, but may include an insulating base material, such as glass, sapphire, spinel, or the like. The substrate (52) may be coupled to a substrate holder (54), for example, to a chuck. The chuck may be any chuck including vacuum, pin-type, groove-type, electrostatic, electromagnetic, or the like. The substrate (52) and substrate holder (54) may be further supported by a stage (56). The stage (56) may provide translating or rotational motion along the X-, Y-, or Z-directions.

The superstrate (58) can be used to planarize a formable material deposited on a substrate (52). The superstrate (58) can be coupled to a superstrate holder (59). The superstrate (58) may be both held by and its shape modulated by the superstrate holder (59). The superstrate holder (59) may be configured to hold the superstrate (58) within a chucking region. The superstrate holder (59) can be configured as vacuum, pin-type, groove-type, electrostatic, electromagnetic, or another similar holder type. In one embodiment, the superstrate holder (59) can include a transparent window within the body of the superstrate holder (59).

The apparatus (50) can further include a fluid dispense system (51) for depositing a formable material (53) on the surface of the substrate (52). The formable material (53) can be positioned on the substrate (52) in one or more layers using techniques such as droplet dispense, spin-coating, dip coating, chemical vapor deposition (CVD), physical vapor deposition (PVD), thin film deposition, thick film deposition, or combinations thereof. The formable material (53) can be dispensed upon the substrate (52) before or after a desired volume is defined between the superstrate (58) and the substrate (52). The formable material (53) can include one or more polymerizable monomers and/or oligomers and/or polymers that can be cured using actinic radiation and/or heat.

The present disclosure is further directed to a method of manufacturing an article. The method can comprise applying a layer of a formable material on a substrate; bringing the layer of the formable material into contact with the superstrate of the present disclosure; and curing the formable material with light or heat to form a cured layer. The substrate and the cured layer may be subjected to additional processing to form a desired article, for example, by including an etching process to transfer an image into the substrate that corresponds to the pattern in one or both of the solidified layer and/or patterned layers that are underneath the solidified layer. The substrate can be further subjected to known steps and processes for device (article) fabrication, including, for example, curing, oxidation, layer formation, deposition, doping, planarization, etching, formable material removal, dicing, bonding, and packaging, and the like. In a certain aspect, the substrate may be processed to produce a plurality of articles.

The cured layer may be further used as an interlayer insulating film of a semiconductor device, such as LSI, system LSI, DRAM, SDRAM, RDRAM, or D-RDRAM, or as a resist film used in a semiconductor manufacturing process.

As further demonstrated in the examples, it has been discovered that an undesired edge bead formed during spin-coating of a protective coating on a superstrate blank can be tolerated if the superstrate blank contains a certain tapered edge design which can cause that an apex of the edge bead may be below the level the coating in the central region.

EXAMPLES

The following non-limiting examples illustrate the concepts as described herein.

Example 1

A superstrate blank was produced by subjecting a round fused silica wafer having a diameter of 300 mm and a thickness of 700 microns to controlled cutting at the edge region of the wafer to form a taper. The cutting was conducted by polishing.

The obtained superstrate blank had the following edge profile: length of the tapered etch region ($T_1$) of 1,8667 mm; taper depth $T_d$ at the outer edge of the wafer of 226 microns; and the taper angle of 6.8°.

A poly(methyl methacrylate) (PMMA) coating was formed on the upper outer surface of the superstrate blank by applying via spin-coating 8 ml of a liquid coating composition 495 PMMA from MicroChem and curing it at a temperature of about 180° C. The liquid coating composition had a viscosity of 204 cP at 23° C. and was applied using a Tel Act12 spin coating machine at a rotation speed of 1000 rpm for 20 seconds, and drying at 1750 rpm for 55 seconds. The thickness of the PMMA coating in the central region of the superstrate blank was about 2 microns.

Figure 6:
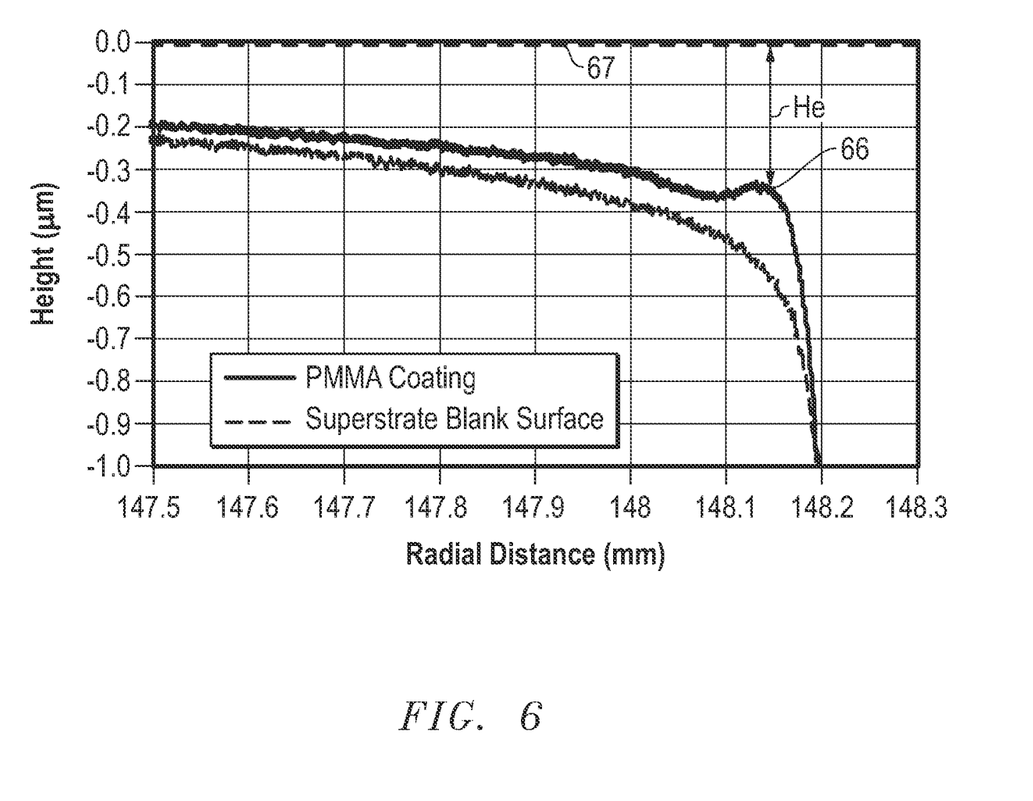
FIG. 6 includes a graph illustrating the shape of the coating and the corresponding shape of the superstrate blank within the tapered edge region of the superstrate of Example 1 according to one embodiment.

The position and size of the formed edge bead of the coating was analyzed using an Bruker Insight Atomic Force Profiling (AFP). As illustrated in FIG. 6, the edge bead was formed within the tapered edge region, very close to the outer edge of the superstrate blank. The edge bead had its apex (66) at about 148.15 mm radial distance from the center point of the superstrate, which corresponds to 1.785 mm from the outer edge of the superstrate.

It can be further clearly seen in FIG. 6 that the apex (66) of the edge bead was lower than the plane of the coating in the central region of the superstrate blank. In FIG. 6, the distance of the apex below the outer surface of the superstrate blank in the central region (67) was −0.35 microns. Adding the thickness of the coating thickness of about 2 microns in the central region, the apex of the edge bead had a negative height (He) of −2.35 microns. A summary of the data is also shown in Table 1 below.

Comparative Example 2

Spin-coating of superstrate blank having wet-etched side regions.

Wet etching of a superstrate blank at the edge region is typically conducted for making spin-coated superstrates having a separation zone.

As starting material (before the etching) were used the same wafers as in Example 1 (before introducing the tapered edge). Wet etching was conducted over an area of about 3 mm from the outer edge of the wafers in a radial direction towards the center of the wafers. The wafers were etched to remove 50 microns of the wafer material in the thickness direction (y) of the wafer (also expressed as depth $T_d$), over the entire 3 mm outer circle region of the wafer.

Spin coating experiments were conducted to form poly (methyl methacrylate) (PMMA) coatings with a thickness of a) about 2 microns and b) about 1 microns on the upper outer surface of the superstrate blank by applying liquid coating composition 495 PMMA from MicroChem as also used in Example 1.

The edge bead of the formed layers was analyzed using a Zygo New View 3D Optical Surface Profiles analyzer.

The analysis of the edge beads formed during spin-coating showed that the location of the edge beads was short before the decline in wafer height caused by the wet-etching.

Table 1 contains a summary of the measured data, such as the height of the formed edge beads (He), expressed as the distance in vertical direction from the plane of the outer surface of the coating in the central wafer region to the apex of the edge bead; and the width of the edge bead (We), expressing the width of the edge bead at the level of the outer surface of the coating.

Figure 3B:
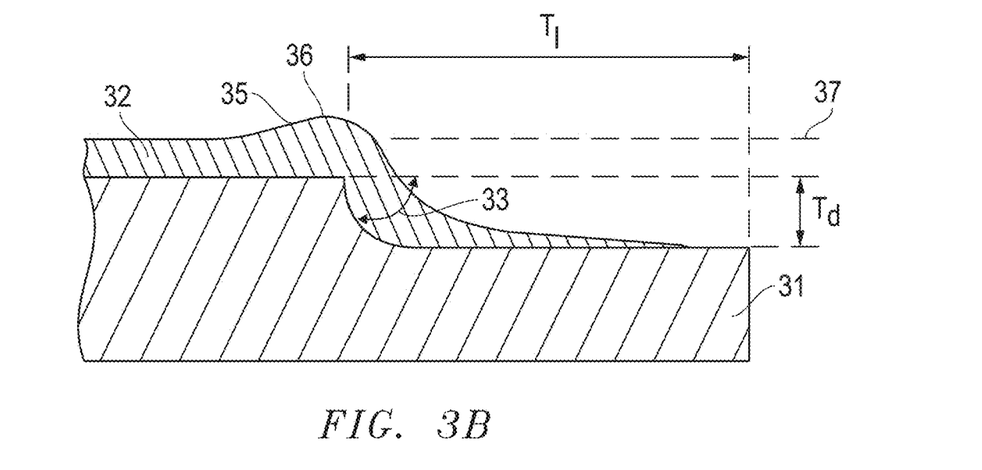
FIG. 3B illustrates a side view of a portion of a comparative superstrate.

A line drawing of the superstrate of Comparative Example 2 is illustrated in FIG. 3B. It can be seen that etching caused a sudden decrease of the height of the superstrate blank (31), with an average taper angle (33) of the decline being 45 degrees or greater. The coating (32) applied by spin coating formed an edge bead (35) with a position of the apex (36) being close before the sudden surface drop of the etched part of the wafer. The apex (36) of the edge bead (35) was above the level (37) of the outer surface of the coating (32) within the central region.

Comparative Example 3

To simulate the edge bead forming on a superstrate blank having no tapered edge region according to the present invention, commercial fused silica wafers of Example 1 were used without further modification of the edge regions. The wafer contained standard rounded edges over a very short radial distance of the wafer.

The wafer had the following edge profile: Length of the edge region $T_1$ between 50-85 microns; depth Ta at the outer edge of wafer between 25-48 microns, and the angle along the rounded edge in relation to the radial direction x of the wafer of about 45 degrees or greater.

The wafers were spin-coated with the same PMMA coating and coating thickness (about 1 micron and about 2 microns) in the central region as conducted in Comparative Example 2.

The wafer analysis showed that the spin coating formed an edge bead at an outer region of the wafer, about 2 mm close to the outer edge.

Figure 3C:
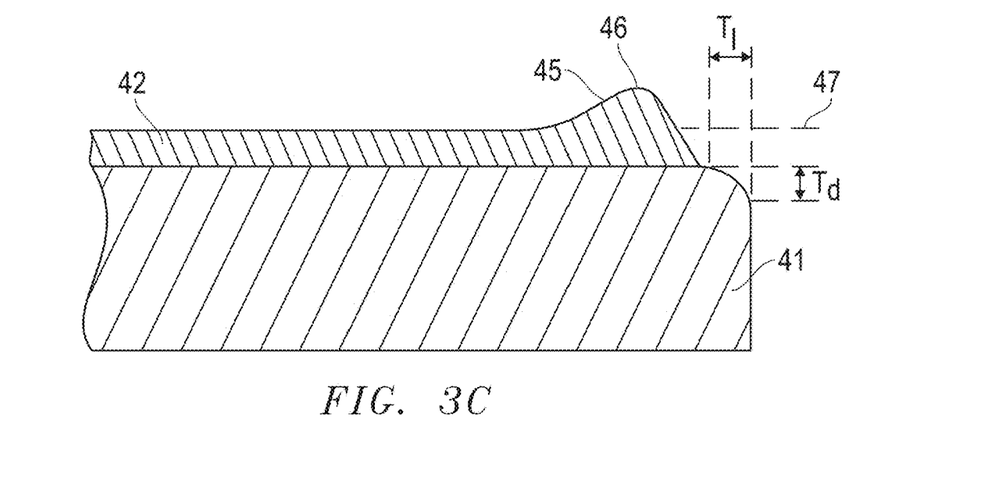
FIG. 3C illustrates a side view of a portion of a comparative coated wafer.

A line drawing of the wafer (41) and the applied coating (42) is illustrated in FIG. 3C. It can be seen that the edge bead (45) was formed before the rounded edge region, wherein the apex (46) of the edge bead (45) was much higher than the plane (47) of the outer surface of the coating within the central region.

Comparison of Data:

Table 1 contains a summary of the measured data of Example 1, and Comparative Examples 2 and 3, such as the height of the formed edge bead (He), and the width of the edge bead (We). Both height (He) and width (We) were measured using the level of the outer surface of the coating in the central region as starting position.

TABLE 1

| Example | Superstrate blank | | | Coating | Edge bead [μm] | |
|---|---|---|---|---|---|---|
| | Length of tapered edge region $T_l$ [mm] | Taper depth $T_d$ [μm] | Taper Angle[°] | thickness in central region[μm] | Height (He) [μm] | Width (We) [μm] |
| E1 | 1.87 | 226 | 6.8 | 2.00 | negative | |
| C2 | 3.00 | 50 | >45 | 0.95 | +0.25 | 1.7 |
| C2 | 3.00 | 50 | >45 | 2.27 | +0.35 | 1.6 |
| C3 | 0.05-0.085 | 0.02-0.04 | >45 | 0.95 | +0.85 | 2.2 |
| C3 | 0.05-0.085 | 0.02-0.04 | >45 | 2.27 | +1.55 | 2.8 |

The testing data summarized in Table 1 show that only the superstrate of Example 1, having a smooth declining taper over an area of about 2 mm at the edge region of the wafer, contained an edge bead having the apex below the level of the coating within the central region.

Wafers subjected to etching at a 3 mm outer ring region of the wafer and spin-coated, contained edge beads having a height of the apex above the plane of the coating in the central region. However, in comparison to the edge beads of spin-coated standard wafers, the wet-etched wafers had a much lower height of the apex. In order to use the wafers of Comparative Examples C2 and C3 as superstrates, it is necessary to remove the edge beads, for example via dissolving or polishing, while the edge bead contained in the superstrate of Example 1 may be tolerated. In certain instances, however, also the edge been of the superstrate of the current disclosure can be removed, for example, by washing with a solvent.

What is claimed is:

1. A superstrate comprising a superstrate blank and a coating overlying an outer surface of the superstrate blank, wherein the superstrate blank comprises a central region and a tapered edge region;

the tapered edge region of the superstrate blank has an average taper angle of not greater than 8 degrees relative to a radial direction of the superstrate blank;

the coating is overlying the central region and at least a portion of the tapered edge region of the superstrate blank; and the superstrate is configured for planarizing a top surface of a formable material positioned on a substrate when bringing the superstrate in contact with the formable material.

2. The superstrate of claim 1, wherein the coating comprises an edge bead within the tapered edge region, and an apex of the edge bead is below a plane of an outer surface of the coating in the central region of the superstrate.

3. The superstrate of claim 1, wherein a surface area ratio Sc:St is at least 15, with Sc being a surface area of the central region and St being a surface area of the tapered edge region.

4. The superstrate of claim 1, wherein a length of the tapered edge region ($T_1$) in radial direction is at least 1.0 mm.

5. The superstrate of claim 1, wherein the superstrate blank has an average thickness within the central region of at least 100 microns and not greater than 5000 microns.

6. The superstrate of claim 1, wherein the coating has an average thickness within the central region of at least 0.1 microns and not greater than 10 microns.

7. The superstrate of claim 1, wherein the coating is transparent to an actinic radiation.

8. A method of forming a planar layer of a formable material on a substrate with a superstrate, comprising:

preparing a superstrate, the superstrate comprising a superstrate blank and a coating overlying an outer surface of the superstrate blank, wherein the superstrate blank comprises a central region and a tapered edge region, the tapered edge region of the superstrate blank has an average taper angle of not greater than 8 degrees, relative to a radial direction of the superstrate blank and the coating overlies the complete central region and at least a portion of the tapered edge region of the superstrate blank;

bringing the superstrate into contact with the formable material on the substrate;

curing the formable material to form the planar layer; and separating the superstrate from the planar layer.

9. The method of claim 8, wherein the coating is applied by spin coating.

10. The method of claim 9, wherein the spin coating comprises forming of an edge bead within the tapered edge region.

11. The method of claim 10, wherein an apex of the edge bead is below a plane of an outer surface of the coating in the central region of the superstrate.

12. The method of claim 10, further comprising removing of the edge bead.

13. The method of claim 8, wherein a surface area ratio Sc:St of the superstrate blank is at least 15, with Sc being a surface area of the central region and St being a surface area of the tapered edge region.

14. The method of claim 9, wherein the spin coating does not include forming of an edge bead on the superstrate blank.

15. The method of claim 8, wherein a length of the tapered edge region ($T_1$) in radial direction is at least 1.0 mm.

16. The method of claim 8, wherein the coating has an average thickness within the central region of at least 0.1 microns and not greater than 10 microns.

17. A method of manufacturing an article comprising:
applying a layer of a formable material on a substrate;
bringing the formable material into contact with a superstrate, wherein the superstrate comprises a superstrate blank and a coating overlying an outer surface of the superstrate blank, and wherein
the superstrate blank comprises a central region and a tapered edge region;
the tapered edge region of the superstrate blank has an average taper angle of not greater than 8 degrees relative to a radial direction of the superstrate blank;
the coating is overlying the complete central region and at least a portion of the tapered edge region of the superstrate blank;
curing the formable material to form the planar layer;
removing the superstrate from the planar layer; and
processing the substrate with the planar layer to make the article.

18. A system for planarizing a formable material, comprising:
a superstrate coupled to a superstrate holder; and
a formable material positioned on a substrate,
wherein the superstrate comprises a superstrate blank and a coating overlying an outer surface of the superstrate blank, wherein the superstrate blank comprises a central region and a tapered edge region; the tapered edge region of the superstrate blank has an average taper angle of not greater than 8 degrees relative to a radial direction of the superstrate blank; and the coating is overlying the central region and at least a portion of the tapered edge region of the superstrate blank; and
wherein the superstrate is positioned above a top surface of the formable material and configured for planarizing the top surface of the formable material.

* * * * *